United States Patent
Tsai et al.

(10) Patent No.: US 9,553,059 B2
(45) Date of Patent: Jan. 24, 2017

(54) BACKSIDE REDISTRIBUTION LAYER (RDL) STRUCTURE

(71) Applicant: Taiwan Semiconductor Manufacturing Company, Ltd., Hsin-Chu (TW)

(72) Inventors: Po-Hao Tsai, Zhongli (TW); Jing-Cheng Lin, Chu Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 45 days.

(21) Appl. No.: 14/137,231

(22) Filed: Dec. 20, 2013

(65) Prior Publication Data

US 2015/0179591 A1 Jun. 25, 2015

(51) Int. Cl.
*H01L 23/00* (2006.01)
*H01L 23/498* (2006.01)
(Continued)

(52) U.S. Cl.
CPC .............. *H01L 24/05* (2013.01); *H01L 24/19* (2013.01); *H01L 24/97* (2013.01); *H01L 25/105* (2013.01); *H01L 25/50* (2013.01); *H01L 23/49827* (2013.01); *H01L 23/5389* (2013.01); *H01L 24/73* (2013.01); *H01L 2224/024* (2013.01); *H01L 2224/0231* (2013.01); *H01L 2224/02331* (2013.01); *H01L 2224/02372* (2013.01); *H01L 2224/04105* (2013.01); *H01L 2224/06181* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/12042* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 2008/0030968 A1* | 2/2008 | Mashino | H01G 4/38 361/767 |
| 2009/0045512 A1* | 2/2009 | Hedler | H01L 21/486 257/738 |

(Continued)

OTHER PUBLICATIONS

Vern Solberg, "μPILR™ Package-on-Package Technology:Development and Reliability Testing",2007, Electronics Packaging Technology Conference, EPTC 2007. 9th.*

*Primary Examiner* — Calvin Choi
*Assistant Examiner* — Xiaoming Liu
(74) *Attorney, Agent, or Firm* — Slater Matsil, LLP

(57) ABSTRACT

An embodiment package on package (PoP) device includes a molding compound having a metal via embedded therein, a passivation layer disposed over the molding compound, the passivation layer including a passivation layer recess vertically aligned with the metal via, and a redistribution layer bond pad capping the metal via, a portion of the redistribution layer bond pad within the passivation layer recess projecting above a top surface of the molding compound.

20 Claims, 15 Drawing Sheets

(51) Int. Cl.
*H01L 21/768* (2006.01)
*H01L 25/10* (2006.01)
*H01L 25/00* (2006.01)
*H01L 23/538* (2006.01)

(56) References Cited

U.S. PATENT DOCUMENTS

| | | | | |
|---|---|---|---|---|
| 2010/0038789 | A1* | 2/2010 | Cheng | H01L 21/28556 257/753 |
| 2010/0308443 | A1* | 12/2010 | Suthiwongsunthorn | H01L 21/486 257/621 |
| 2011/0155433 | A1* | 6/2011 | Funaya | H01L 24/24 174/258 |
| 2013/0062761 | A1* | 3/2013 | Lin | H01L 23/49816 257/738 |
| 2013/0214423 | A1* | 8/2013 | Sadaka | H01L 21/486 257/774 |

* cited by examiner

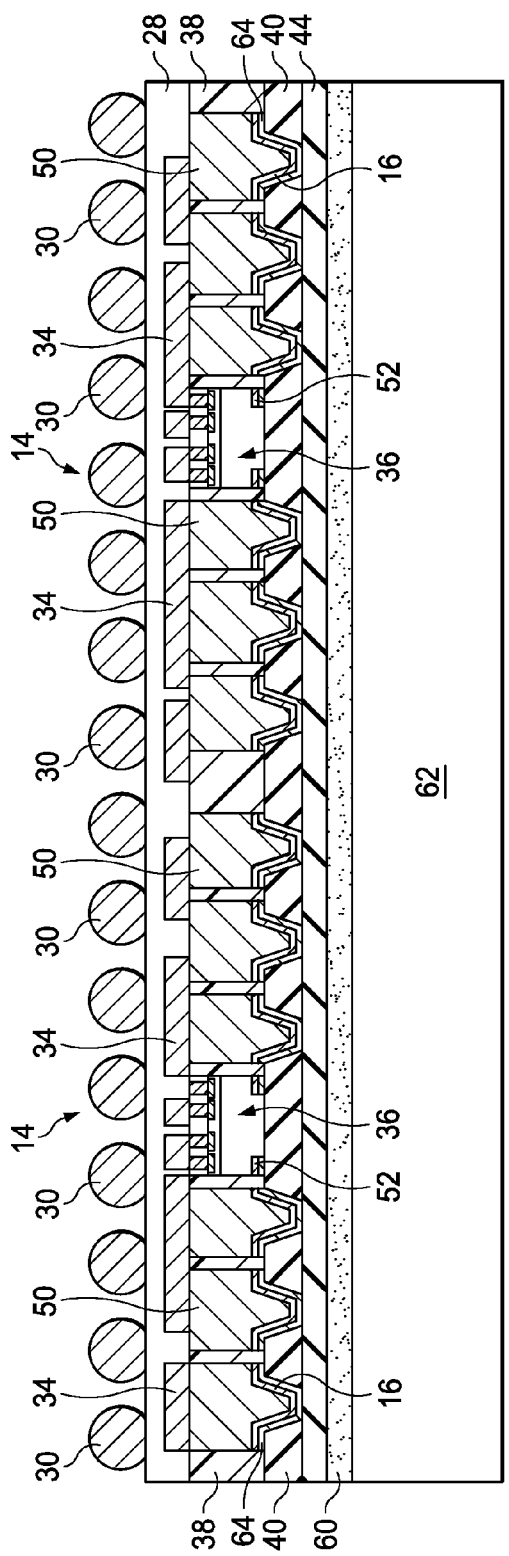
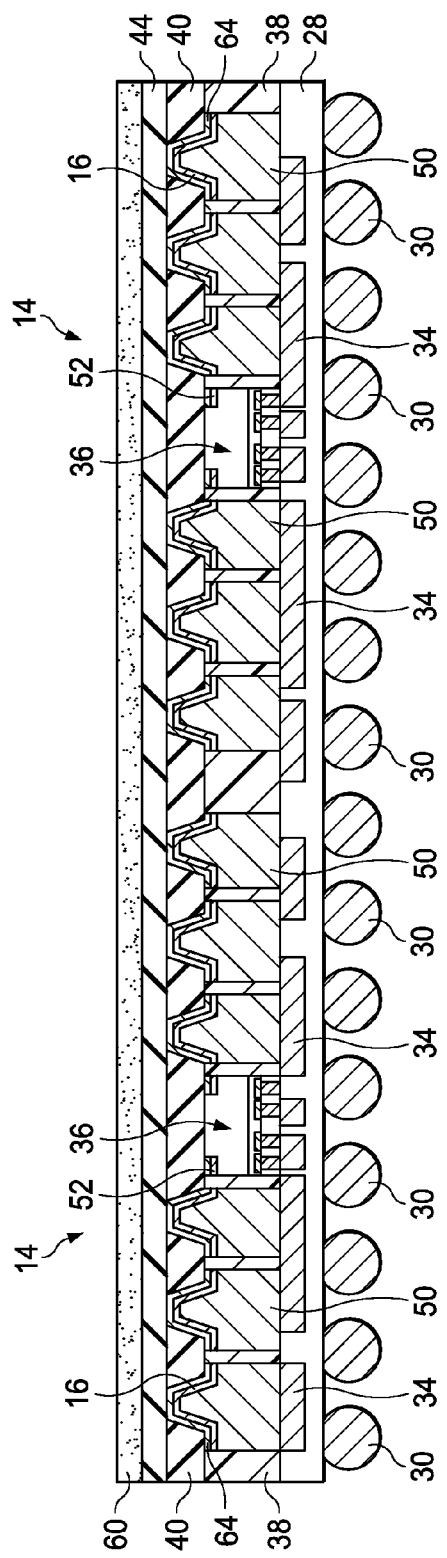

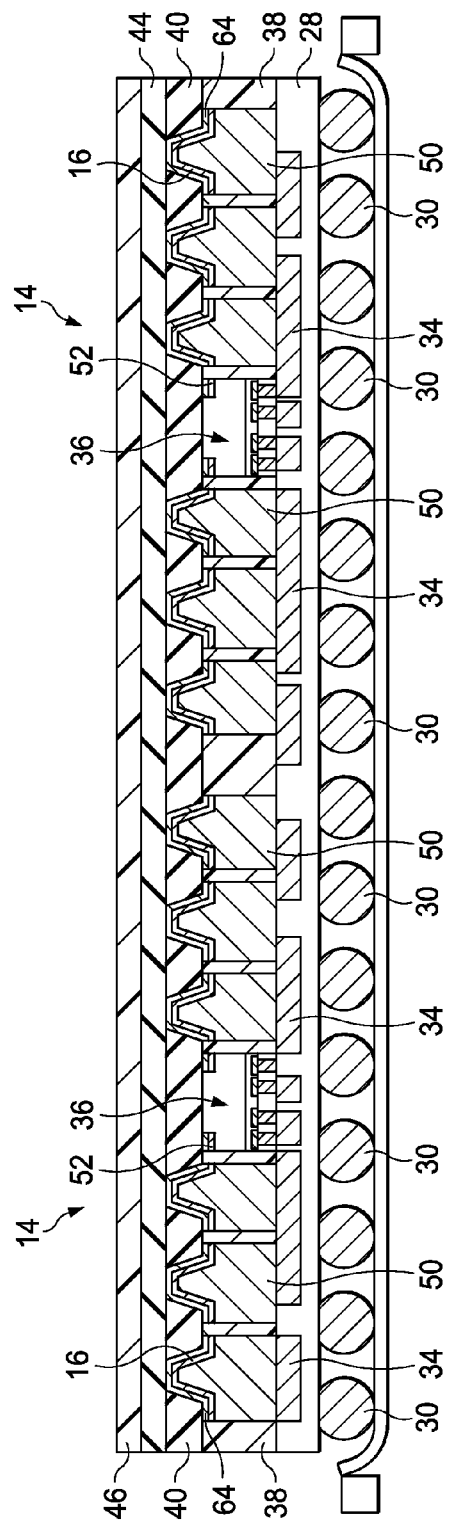
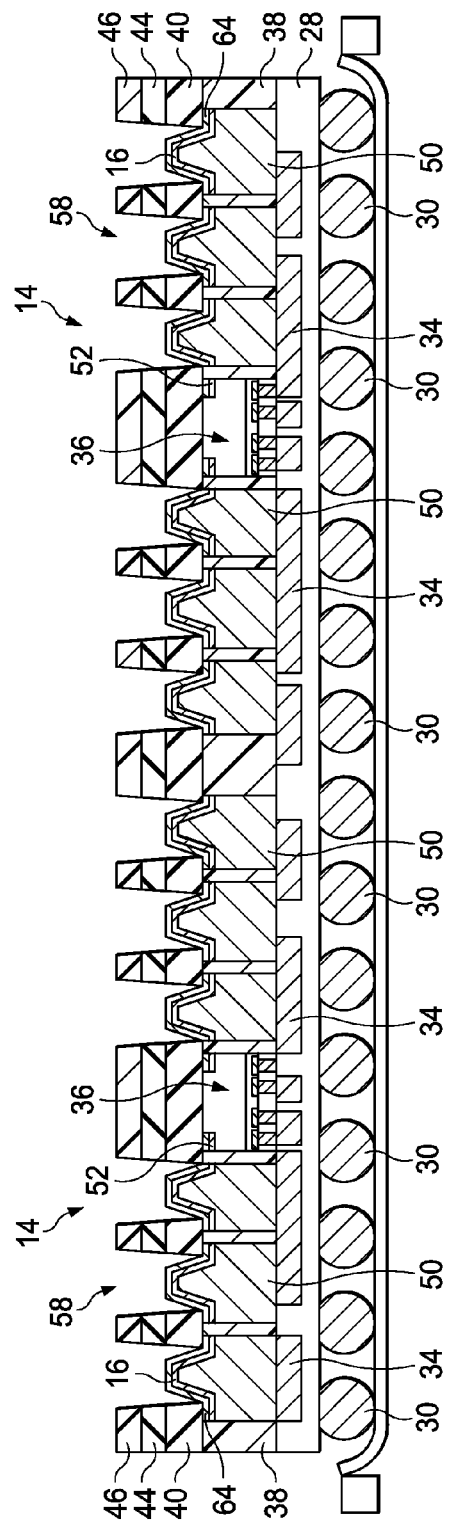
FIG. 4P
FIG. 4Q

BACKSIDE REDISTRIBUTION LAYER (RDL) STRUCTURE

BACKGROUND

As the demand for smaller electronic products grows, manufacturers and others in the electronics industry continually seek ways to reduce the size of integrated circuits used in the electronic products. In that regard, three-dimensional (3D) type integrated circuit (IC) packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages. In some cases, the PoP device is referred to an integrated fan-out (InFO) PoP device because the contact positions of the original die are "fanned out" to a larger foot print.

If not appropriately or suitably formed, the InFO PoP devices may be subject to electrical failures or have poor reliability. For example, the InFO PoP devices may experience crack propagation or suffer ball fatigue.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a three dimensional (3D) integrated fan-out (InFO) package-on-package (PoP) device. The concepts in the disclosure may also apply, however, to other semiconductor structures or circuits.

Figure 1:
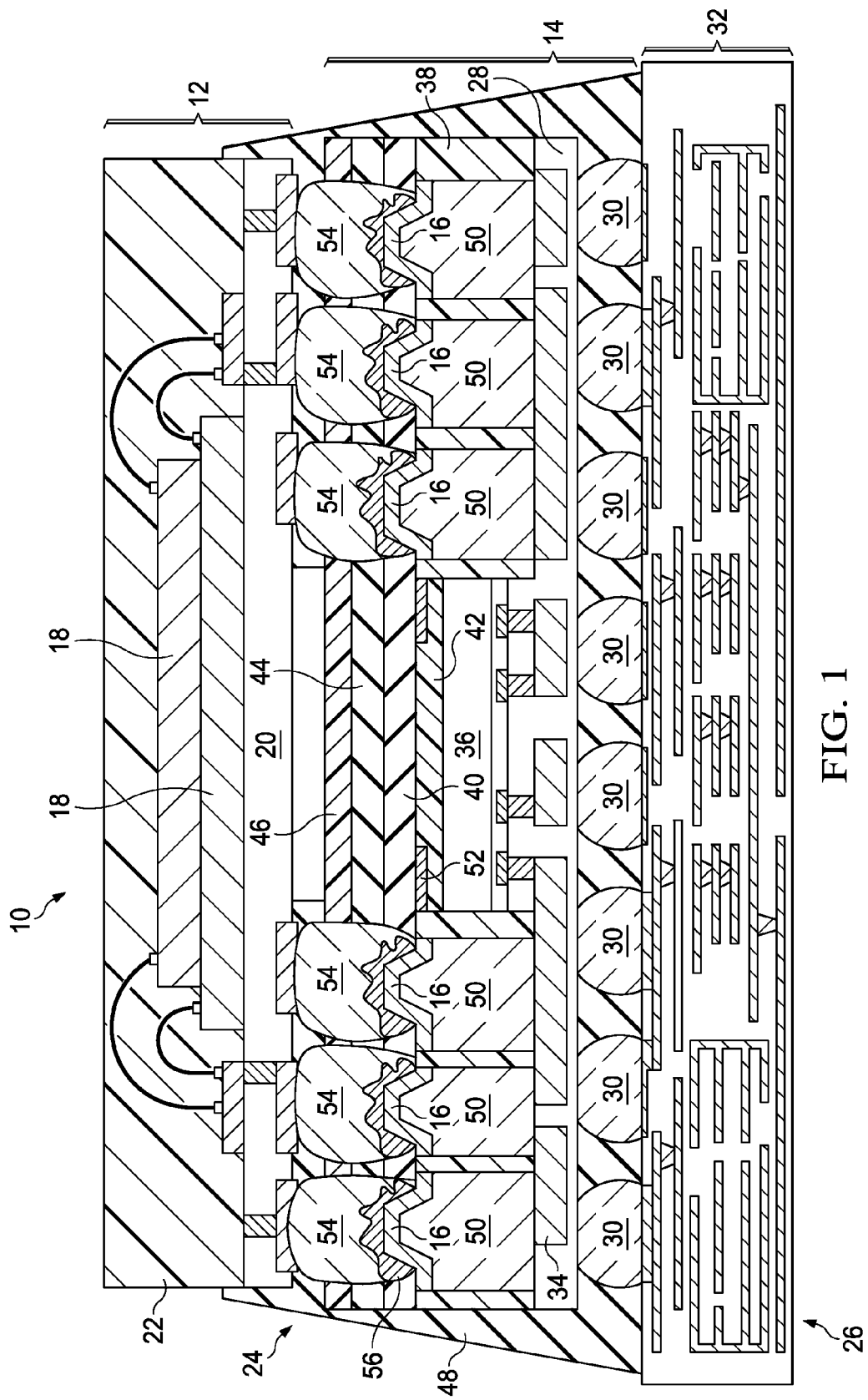
FIG. 1 illustrates an embodiment package on package (PoP) device utilizing protruding redistribution layer bond pads.

Referring now to FIG. 1, an embodiment PoP device 10 is illustrated. As shown, the PoP device 10 includes a top package 12 electrically coupled to a bottom package 14 using a protruding redistribution layer bond pad 16. As will be more fully explained below, the protruding or upwardly-projecting redistribution layer bond pad 16 provides numerous advantages and benefits for the PoP device 10 relative to other PoP devices. For example, the protruding redistribution layer bond pad 16 permits a backside redistribution layer (RDL) to be formed in an Integrated Fan Out Package on Package (InFO PoP) device, prevents cracks from occurring or propagating within the PoP device (e.g., between the molding compound and the metal via, at the backside RDL polymer, etc.), and so on.

As shown in FIG. 1, the top package 12 is mounted above the bottom package 14 in the embodiment PoP device 10. The top package 12 may include one or more dies 18. In an embodiment, the dies 18 are vertically discrete memory components. For example, each of the dies 18 may be a memory component such as, for example, a dynamic random access memory (DRAM) or another suitable type of memory. While two of the dies 18 are depicted in FIG. 1, more or fewer of the dies 18 may be included in other embodiments.

In an embodiment, the dies 18 in the top package 12 are electrically coupled to the bottom package 14 through wiring bonding as well as vias and contact pads in a top package substrate 20. The top package 12 may include molding compound 22 or another suitable encapsulant to cover the dies 18 and protect the wire bonding connections. In practical applications, each of the top and bottom packages 12, 14 may include various other components, layers, circuits, and structures that have been omitted herein for the sake of brevity.

The bottom package 14 has a front side 26 and a backside 24. At the front side 26, the bottom package 14 includes a bottom package substrate 28. In an embodiment, the bottom package substrate 28 is a polybenzoxaxole (PBO) or other suitable substrate material. As shown in FIG. 1, a number of solder features 30 are mounted to the bottom package substrate 28. In an embodiment, the solder features 30 are solder balls from a ball grid array (BGA). As shown, the solder features 30 permit the bottom package 14 to be mounted and electrically coupled to, for example, an underlying printed circuit board (PCB) 32 or other component.

The bottom package substrate 28 includes a front side redistribution layer 34. The frontside RDL 34 electrically couples a die 36 in the bottom package 14 to, for example, the solder features 30 and the PCB 32. In an embodiment, the die 36 in the bottom package 14 is a logic device or logic component (a logic integrated circuit, analog circuit, and so on). While one of the dies 36 is depicted in FIG. 1, it should be recognized that more of the dies 36 may be included in other embodiments. In an embodiment, the die 36 is encapsulated by molding compound 38 or another suitable encapsulant to cover the die 36.

In an embodiment, the die 36 is mounted beneath or to a passivation layer 40 using a die attach film (DAF) 42. In an embodiment, the passivation layer 40 comprises polybenzoxaxole (PBO), an Ajinomoto build-up film (ABF), or other suitable material. A buffer layer 44 may be disposed over the passivation layer 40. In an embodiment, the buffer layer 44 comprises PBO, an ABF, or other suitable material. Optionally, a laminating tape 46 may be disposed over the buffer layer 44. When used, the laminating tape 46 comprises a solder release (SR) film, an ABF, a backside laminating coating tape (LC tape) comprising a thermosetting polymer, or other suitable material.

In an embodiment, an underfill material 48 may be used to encapsulate portions of the top and bottom packages 12, 14 as shown in FIG. 1. The underfill material 48 may extend from a top surface of the PCB 32, along sides of the bottom package 14, and along a portion of the sides of the top package 12. In an embodiment, the underfill material 48 is only disposed between the top package substrate 20 and the laminating tape 46 or the buffer layer 44 if the laminating tape 46 was not used.

Still referring to FIG. 1, the bottom package 14 also includes through package vias (TPV) 50 extending between the front side 26 and the backside 24 of the bottom package 14. The through package vias 50, which may also be referred to herein as through InFO vias (TIVs) or metal vias, are embedded in and pass through the molding compound 38. In an embodiment, the through package vias 50 comprise copper, nickel (Ni), a copper alloy (copper/titanium), solder, a solder alloy including tin-silver (SnAg), tin-bismuth (SnBi), tin-copper (SnCu), tin-silver-copper (SnAgCu), tin-silver-copper-nickel (SnAgCuNi), or combinations thereof, or another metal. While six of the through package vias 50 are illustrated in FIG. 1, more or fewer of the through package vias 50 may be included in other embodiments.

The bottom package 14 also includes a backside redistribution layer 52. As shown, a portion of the backside redistribution layer (RDL) 52 extends over a top surface of the die 36. As such, the die 36 is electrically coupled to, for example, the dies 18 in the top package 12 and the through package vias 50. In addition, another portion of the backside redistribution layer 52 extends over the through package vias 50. In particular, the protruding redistribution layer bond pads 16 from the backside redistribution layer 52 are disposed on the upper portions of the through package vias 50. As will be more fully explained below, the protruding redistribution layer bond pads 16 cap or otherwise cover the top of the through package vias 50 in FIG. 1. In an embodiment, the protruding redistribution layer bond pads 16 and the through package vias 50 are formed from the same material (e.g., copper). As such, the protruding redistribution layer bond pads 16 and the through package vias 50 may appear to be a single unitary structure.

Solder features 54 are formed or mounted on, and electrically coupled to, the protruding redistribution layer bond pads 16. The solder features 54 electrically couple the top package 12 with the bottom package 14. In an embodiment, the solder features 54 are formed from solder paste, organic solderability preservative (OSP), or other suitable conductive material, or combinations thereof. In an embodiment, an intermetallic compound (IMC) 56 is disposed between the solder features 54 and the underlying redistribution layer bond pads 16 capping the through package vias 50. The intermetallic compound 56 is a product of a reflow process used to electrically couple the solder feature 54 and the through package vias 50.

Referring now to FIGS. 2A-2D, embodiments of the redistribution layer bond pads 16 capping the through package vias 50 are depicted in further detail. For the purposes of illustration, the solder feature 54 from the PoP device 10 (see FIG. 1) has been omitted.

Figure 2A:
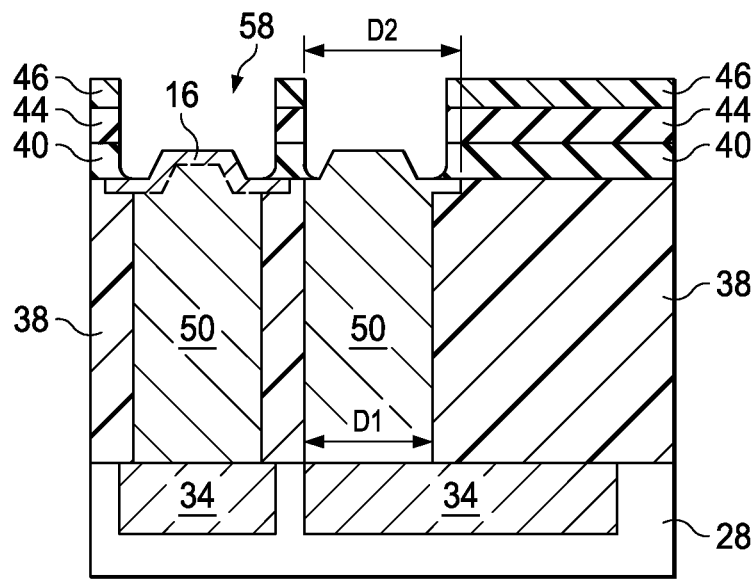
FIGS. 2A-2D illustrate embodiments of the redistribution layer bond pads in the PoP device of FIG. 1 capping metal vias.

In FIG. 2A, the through package vias 50 are embedded in the molding compound 38. The through package vias 50 extend from the redistribution layer bond pad 16 of the backside redistribution layer 52 to the front side redistribution layer 34 in the bottom package substrate 28. The passivation layer 40 is disposed over the molding compound 38 and the buffer layer 44 and the optional tape layer 46 are disposed over the passivation layer 40. As shown, a recess 58 extends through the passivation layer 40, the buffer layer 44, and the optional tape layer 46. The recess 58 is vertically aligned with the underlying through package via 50.

The redistribution layer bond pad 16 in FIG. 2A caps or otherwise covers the top surface of the through package via 50. Moreover, a portion of the redistribution layer bond pad 16 projects or extends above a top surface of the molding compound 38. In an embodiment, the central portion of the redistribution layer bond pad 16 protrudes or projects upwardly into the recess 58 while outer portions of the redistribution layer bond pad 16 are embedded in the molding compound 38. In other words, in an embodiment the redistribution layer bond pad 16 has a non-linear profile.

As shown, sidewalls of the portion of the redistribution layer bond pad 16 projecting above the top surface of the molding compound 38 are spaced apart from sidewalls of the laterally adjacent passivation layer 40. In an embodiment, a redistribution layer bond pad diameter D2 is greater than a metal via diameter D1. In addition, and as will be more fully explained below, no seed metal is disposed between the through package via 50 and the redistribution layer bond pad 16 in the embodiment of FIG. 2A.

Figure 2B:
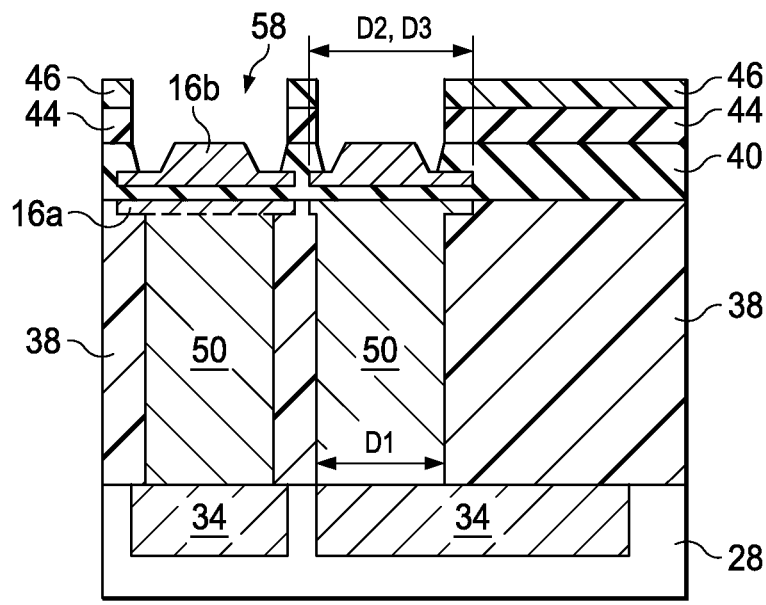

Referring now to FIG. 2B, a first redistribution layer bond pad 16a caps the metal via 50. In addition, a second redistribution layer bond pad 16b is vertically spaced apart from the first redistribution layer bond pad 16a by a portion of the passivation layer 40. As shown, a portion of the second redistribution layer bond pad 16b within the recess 58 projects upwardly away from the molding compound 38 and the underlying metal via 50. In an embodiment, a first redistribution layer bond pad diameter D2 and a second redistribution layer bond pad D3 are each greater than a metal via diameter D1.

Figure 2C:
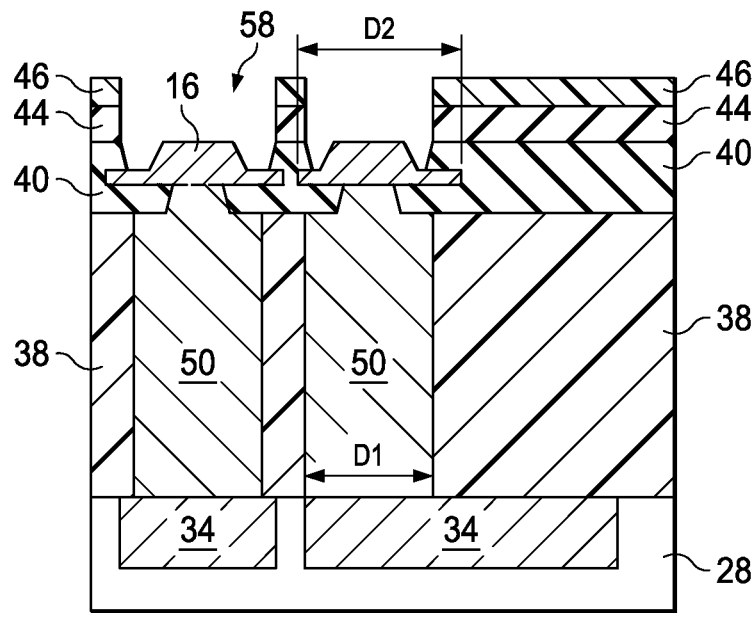

Referring now to FIG. 2C, the redistribution layer bond pad 16 caps the metal via 50. However, unlike the embodiment in FIG. 2A, a portion of the passivation layer 40 is disposed between the redistribution layer bond pad 16 and the metal via 50. In an embodiment, the redistribution layer bond pad diameter D2 is greater than the metal via diameter D1.

Figure 2D:
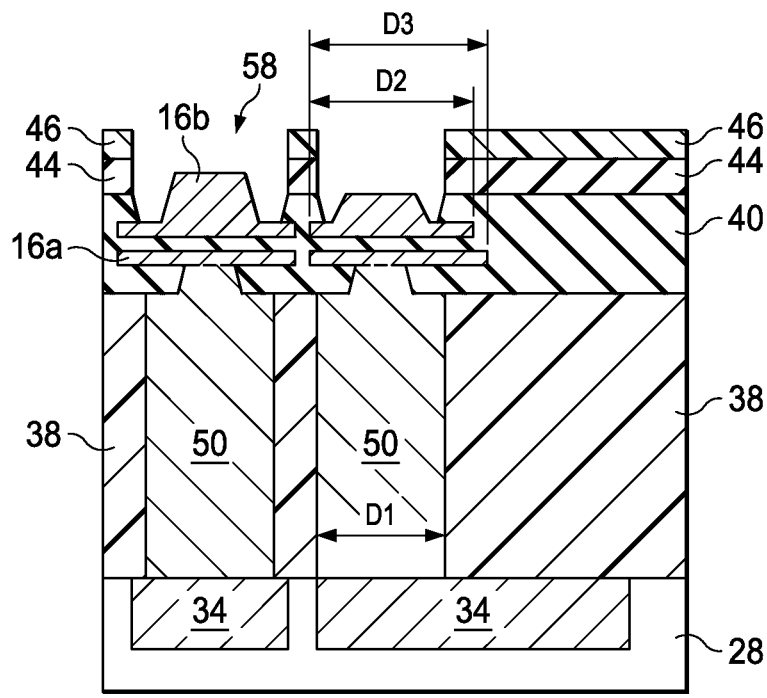

Referring now to FIG. 2D, the first redistribution layer bond pad 16a caps the metal via 50. However, a portion of the passivation layer 40 is disposed between the first redistribution layer bond pad 16a and the metal via 50. In addition, the second redistribution layer bond pad 16b is vertically spaced apart from the first redistribution layer bond pad 16a by another portion of the passivation layer 40. As shown, a portion of the second redistribution layer bond pad 16b within the recess 58 projects upwardly away from the top surface of the molding compound 38 and the metal via 50. In an embodiment, the first redistribution layer bond pad diameter D2 and the second redistribution layer bond pad D3 are each greater than the metal via diameter D1.

Figure 3:
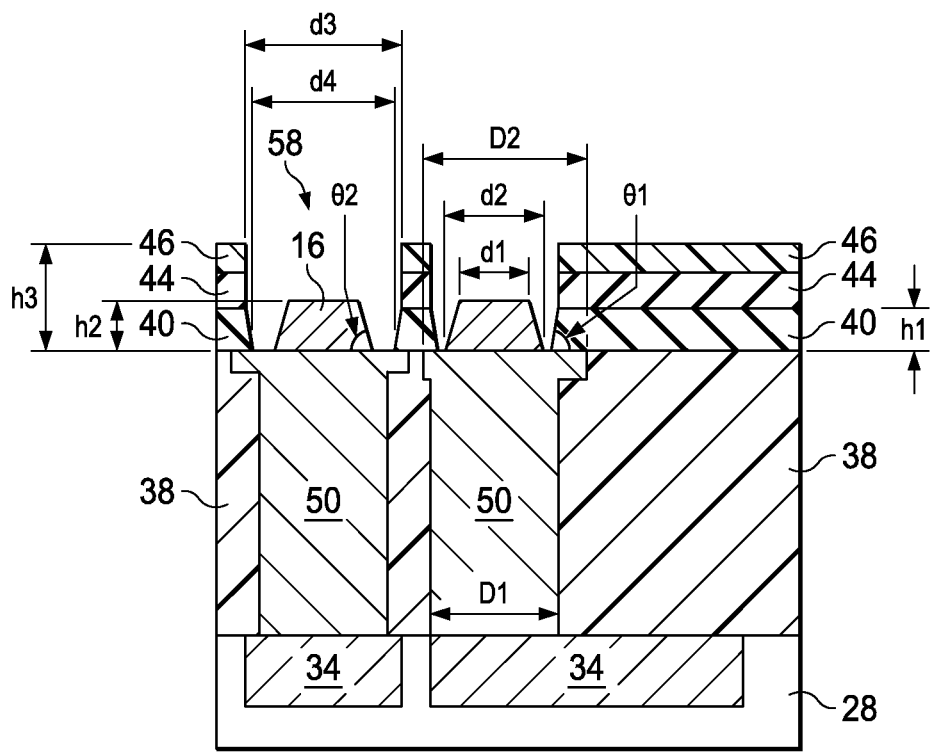
FIG. 3 illustrates dimension lines and angles pertaining to embodiment redistribution layer bond pads.

Referring now to FIG. 3, the embodiment redistribution layer bond pad 16 and metal via 50 depicted in FIG. 2A has been reproduced with dimension lines and angles, which may apply to the various embodiments described herein. In an embodiment, a diameter d1 of a top surface of the redistribution layer bond pad is less than or equal to a diameter d2 of a sidewall base of the redistribution layer bond pad.

In an embodiment, a profile angle $\theta_2$ of the redistribution layer bond pad, which is defined by sidewalls and a plane extending between a top surface of bond pad legs, is between about forty degrees and about ninety degrees. In an embodiment, a height h2 of the redistribution layer bond pad disposed above the molding compound 38 is greater than or equal to a height h1 of the passivation layer. In an embodiment, the height h2 is between about 1 μm and about 15 μm.

In an embodiment, the diameter d1 satisfies the formula: $d1=d2-2[h1(\tan \theta 2)]$, where d2 is the diameter of the sidewall base of the redistribution layer bond pad, h1 is the height of the passivation layer, and $\theta_2$ is the profile angle of the redistribution layer bond pad defined by sidewalls and a plane extending between a top surface of bond pad legs. In an embodiment, the diameter d1 is between about 65 µm and about 290 µm.

In an embodiment, the diameter D2 of the redistribution layer bond pad is greater than or equal to the diameter d2 of a sidewall base of the redistribution layer bond pad. In an embodiment, diameter D2 is between about 30 µm and about 380 µm. In an embodiment, diameter d2 is between about 80 µm and about 300 µm.

In an embodiment, the diameter D1 of the metal via 50 is less than or equal to the diameter d2 of a sidewall base of the redistribution layer bond pad. In an embodiment, diameter D1 is between about 80 µm and about 300 µm. In an embodiment, diameter d2 is between about 80 µm and about 300 µm. In an embodiment, the protruding redistribution layer bond pad 16 has a roughness (Ra) of between about 0.2 µm to about 1 µm.

In an embodiment, a diameter d3 at the top of the recess 58 (which exist in the tape layer 46, the buffer layer 44, or the passivation layer 40 depending on the layers used for fabrication of the PoP device 10) is greater than a diameter d4 at the bottom of the recess 58. In other words, the recess 58 gets progressively wider from bottom to top and a top opening of the recess 58 is greater than a bottom opening of the recess 58.

In an embodiment, a height h3 of the tape layer 46, the buffer layer 44, and/or the passivation layer 40 (depending on the layers used for fabrication of the PoP device 10) is greater than the height h2 of the redistribution layer bond pad 16 disposed above the molding compound 38. If, however, a portion of the passivation layer 40 is disposed beneath the redistribution layer bond pad 16 (see, for example, FIG. 2B), then the height h2 is measured from a top surface of the laterally extending legs of the redistribution layer bond pad 16. In an embodiment, the height h3 is between about 1 µm and about 55 µm. In an embodiment, an open profile angle $\theta_1$ of the recess 58, which is defined by sidewalls of the recess 58 and a top surface of legs of the redistribution layer bond pad 16, is between about forty degrees and about seventy degrees.

Figure 4A:
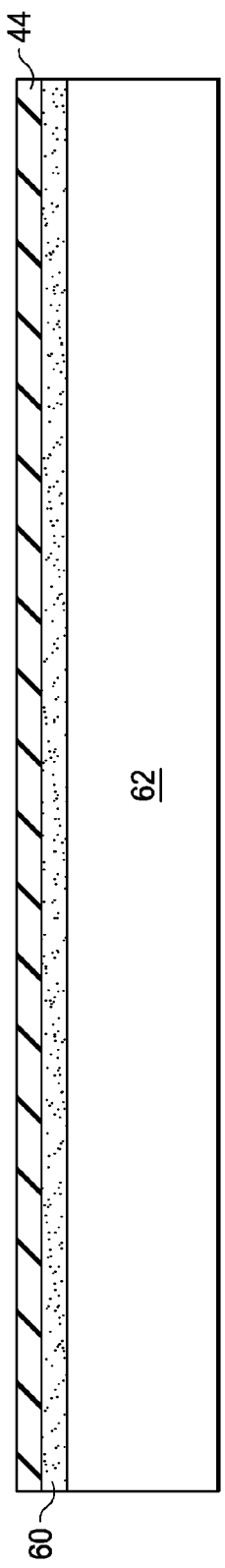
FIGS. 4A-4T collectively schematically illustrates a process flow used to manufacture the embodiment PoP device 10 utilizing the protruding redistribution bond pads of FIG. 1.
Figure 4B:
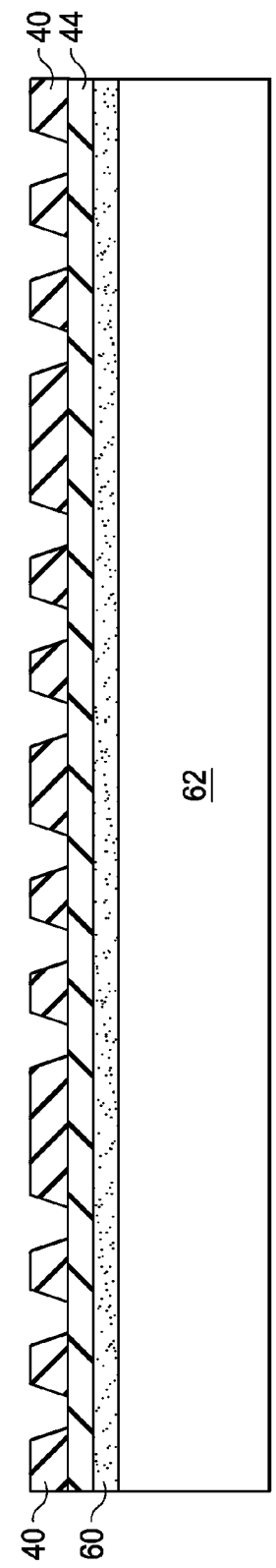
Figure 4C:
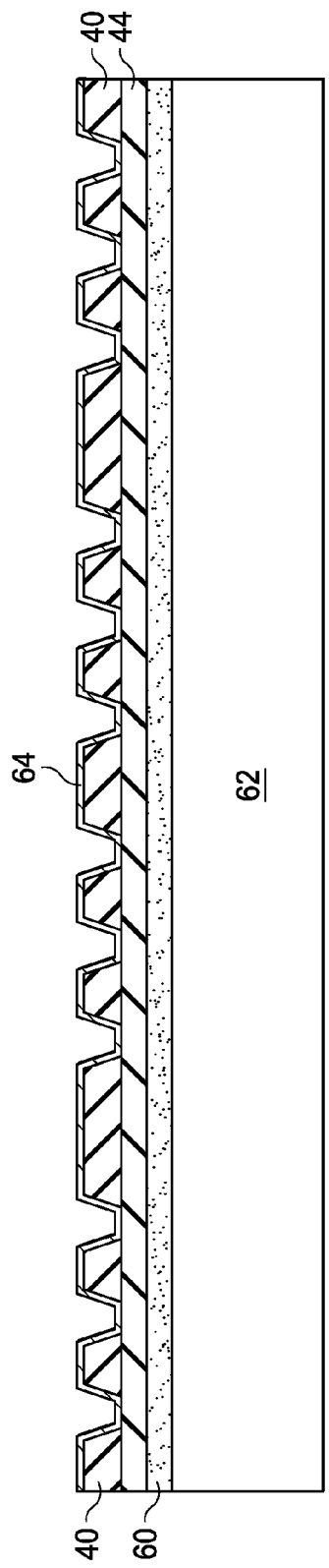
Figure 4D:
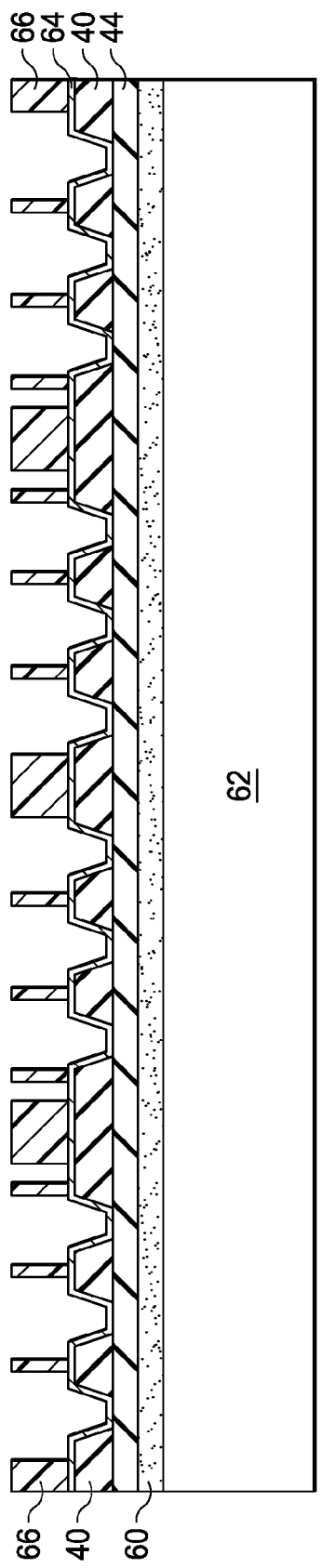
Figure 4E:
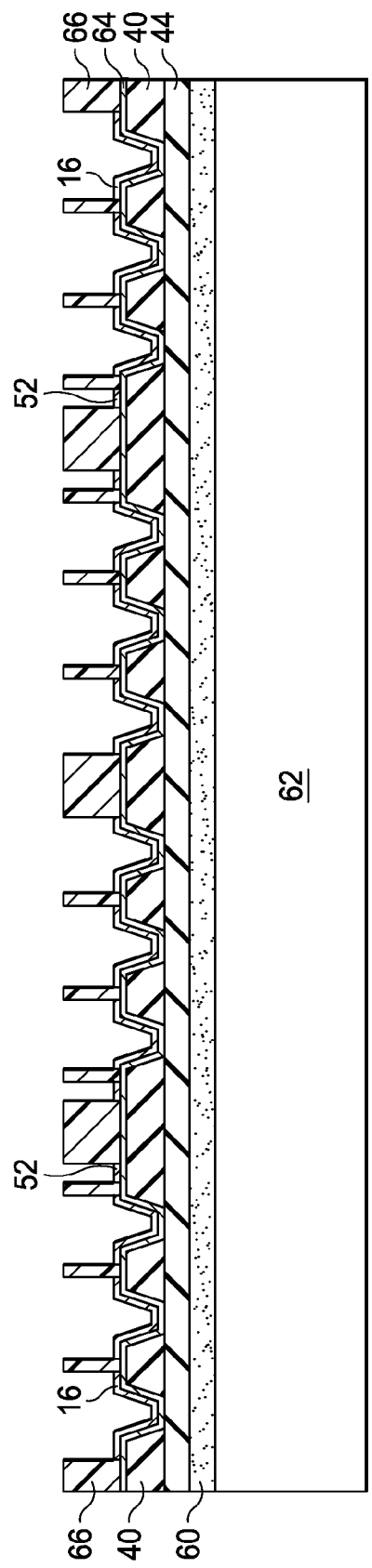
Figure 4F:
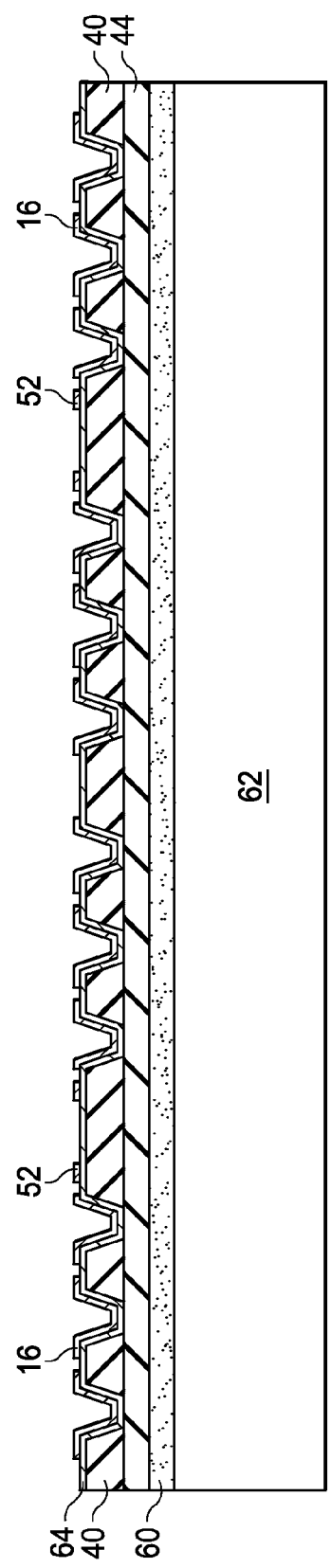
Figure 4G:
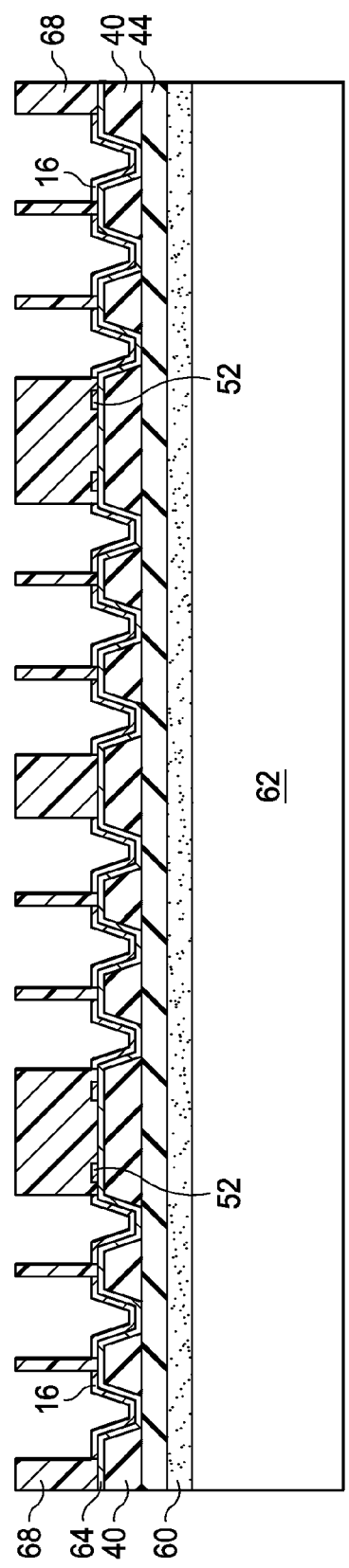
Figure 4H:
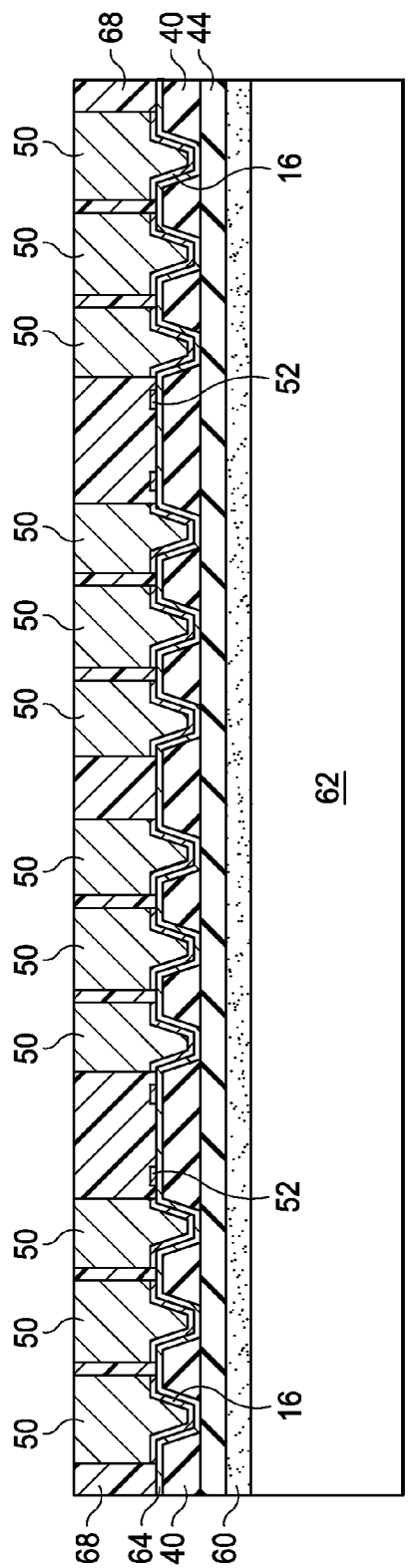
Figure 4I:
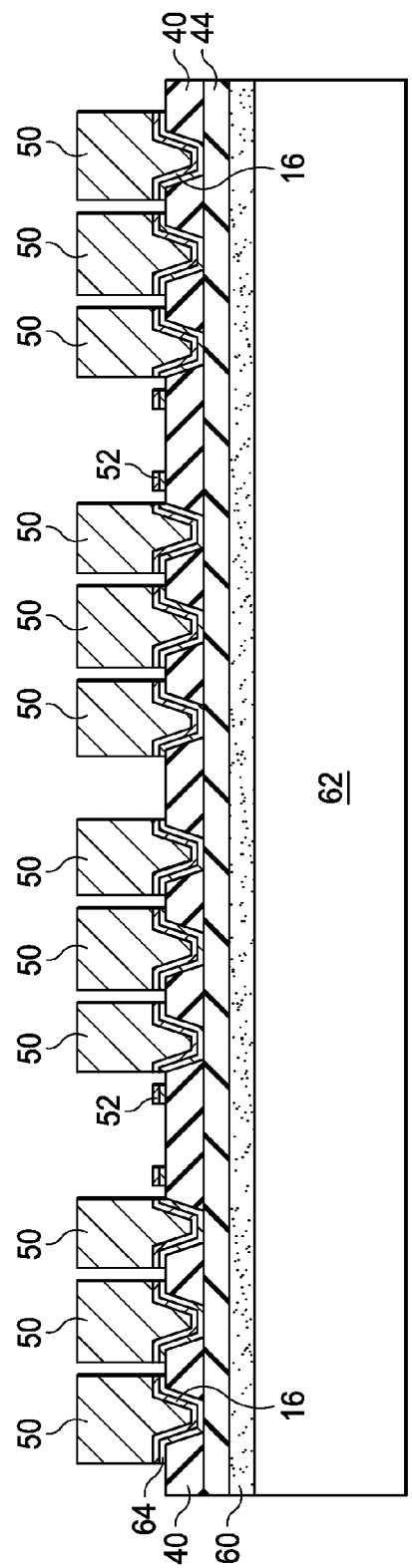
Figure 4J:
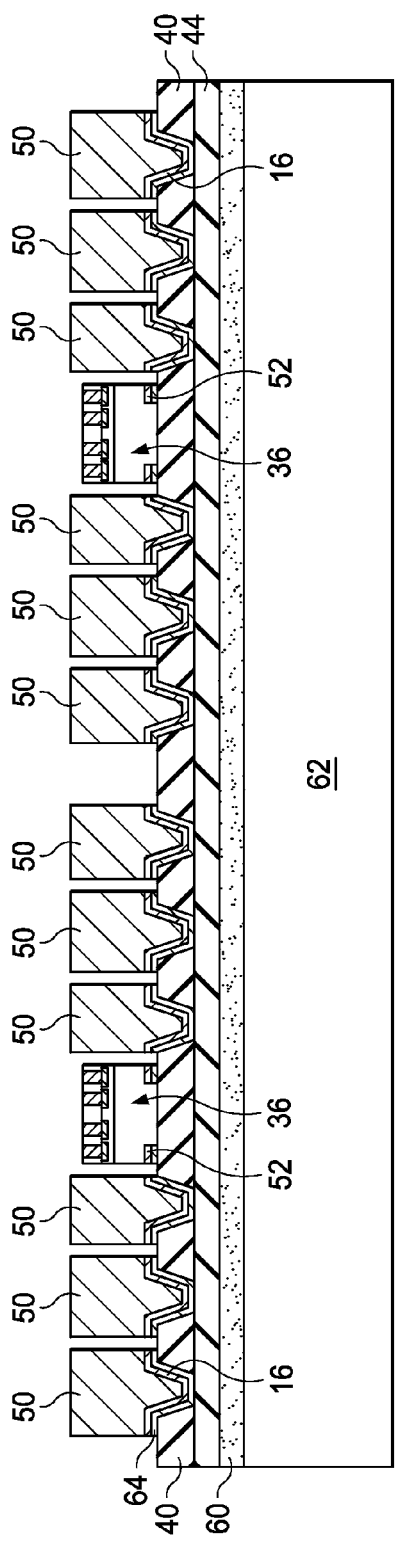
Figure 4K:
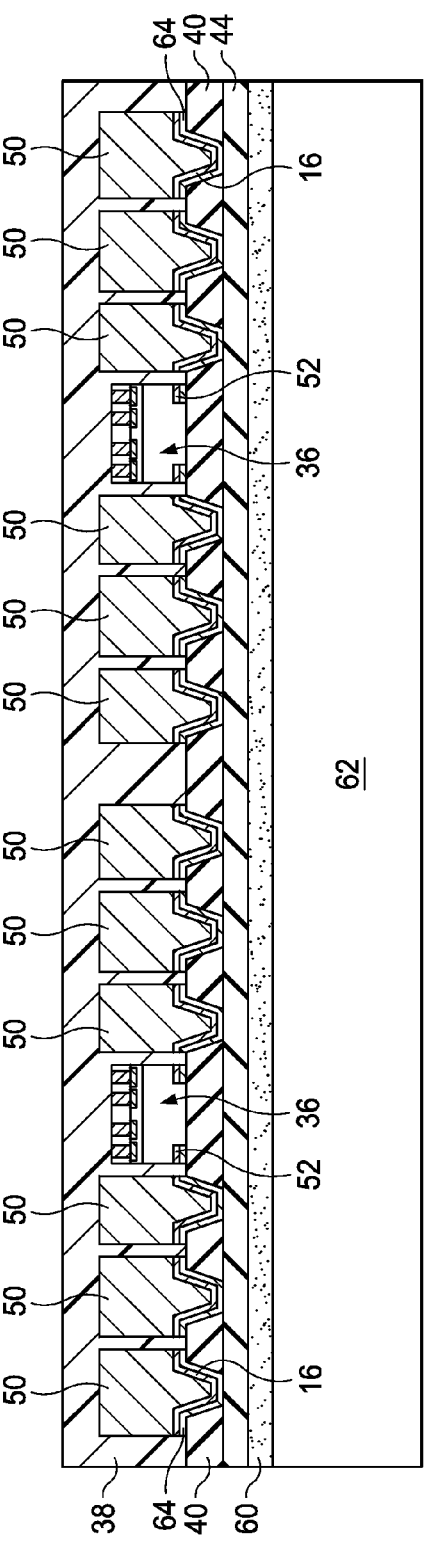
Figure 4L:
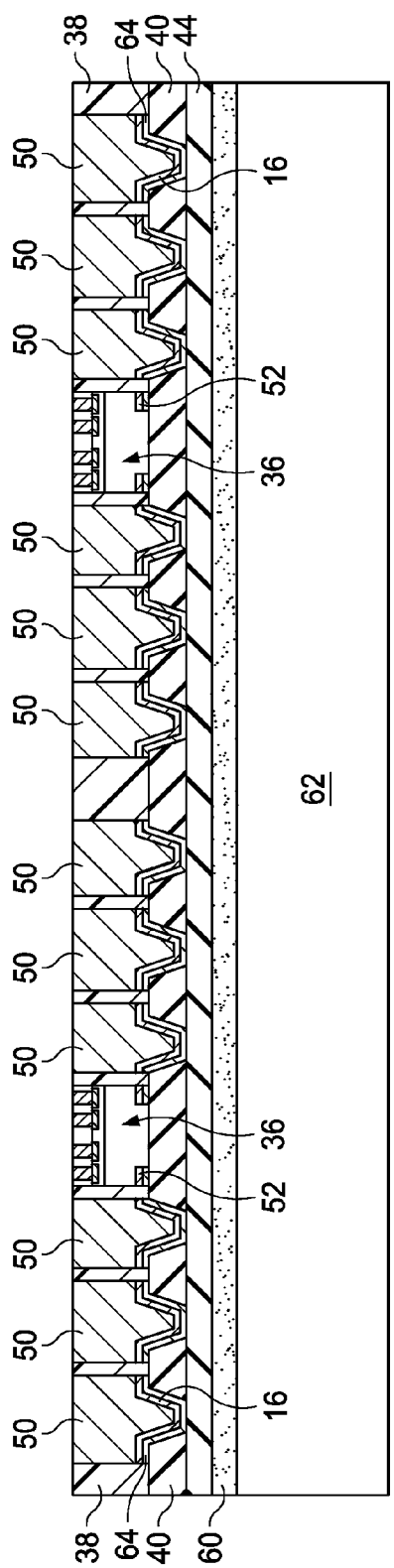
Figure 4M:
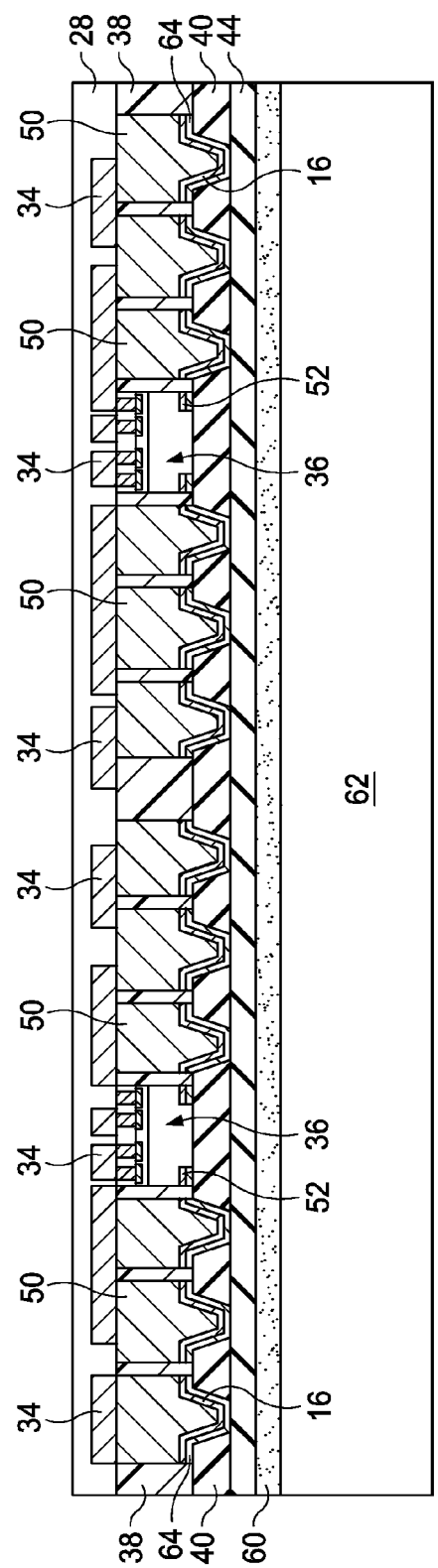
Figure 4R:
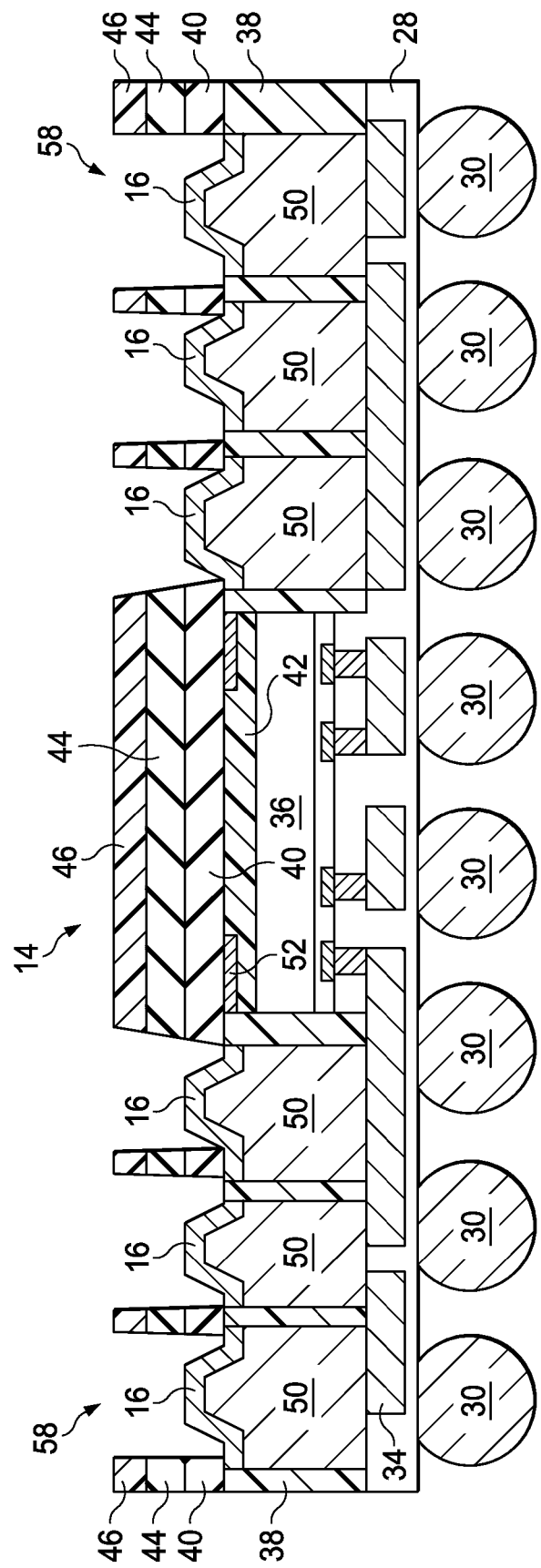
Figure 4S:
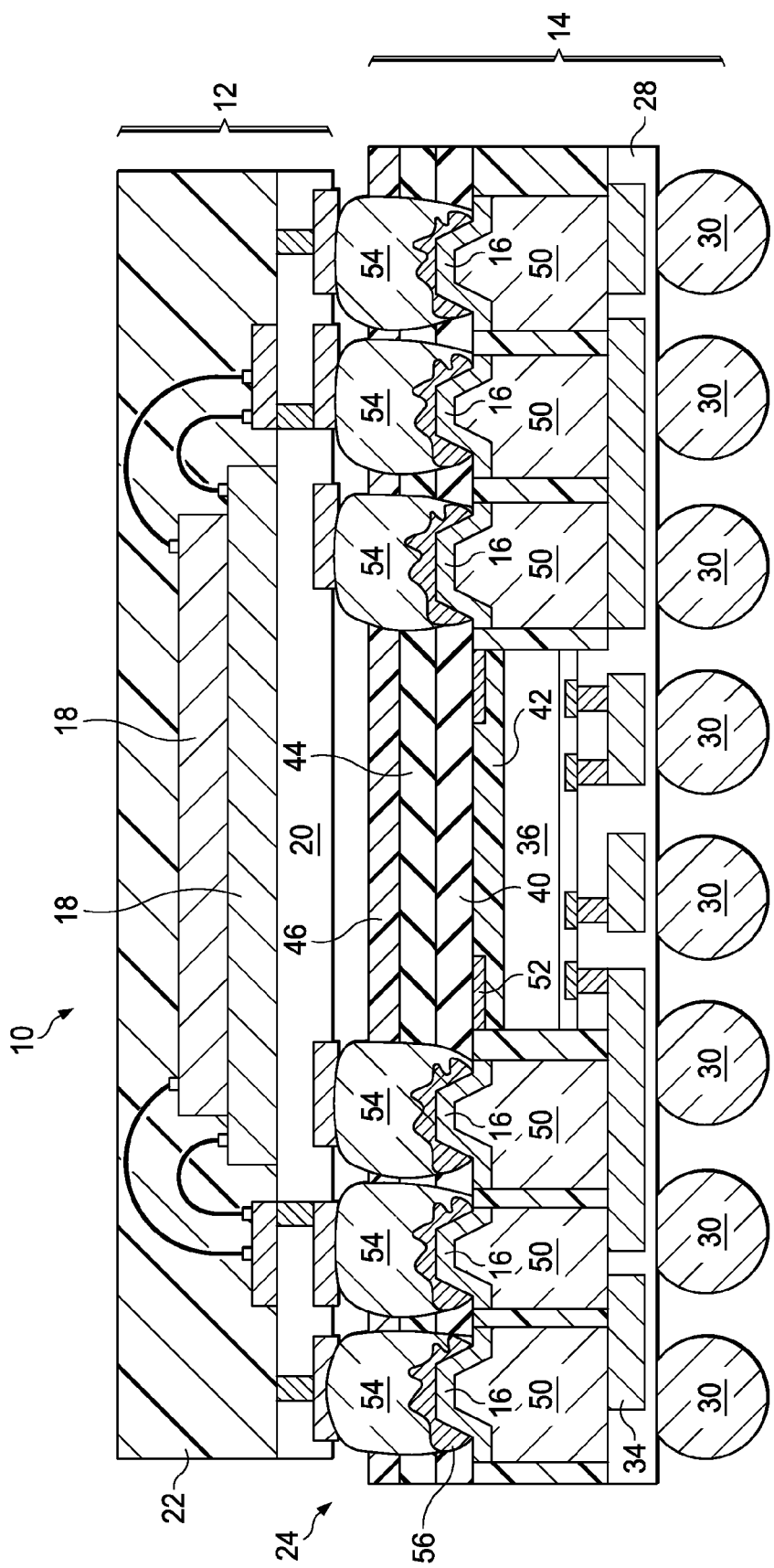
Figure 4T:
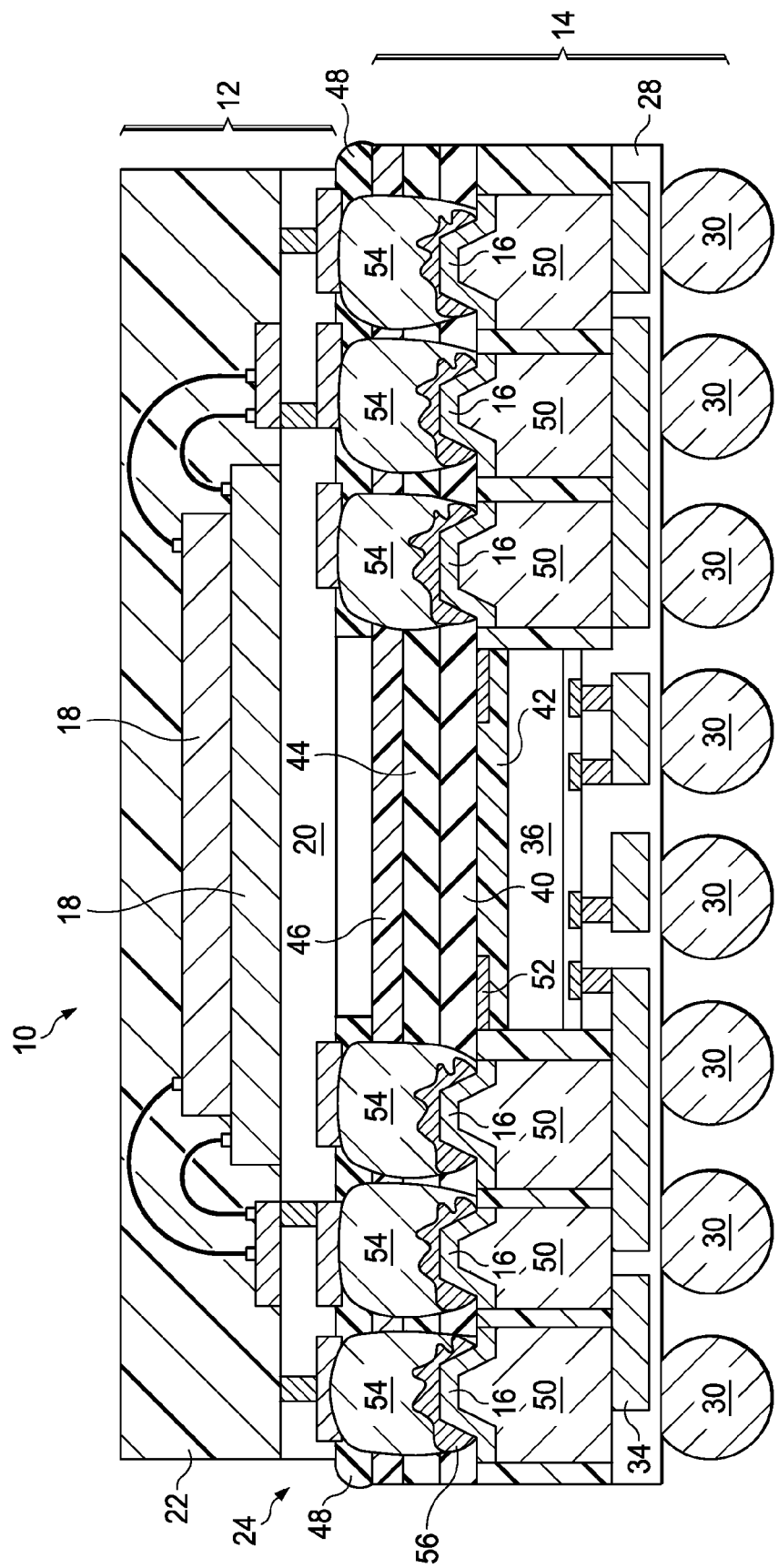

FIGS. 4A-4T collectively schematically illustrate a process flow used to manufacture the embodiment PoP device 10 utilizing the protruding redistribution bond pads 16 as shown in FIGS. 1 and 2A. In FIG. 4A, a glue layer 60 and the buffer layer 44 are deposited over a carrier 62. In FIG. 4B, the passivation layer 40 is deposited over the buffer layer 44 and then patterned. In FIG. 4C, a seed metal 64 is deposited over the patterned passivation layer 40. In an embodiment, the seed metal 64 is copper, a copper alloy (e.g., copper/titanium), or another metal.

In FIG. 4D, a photo resist (PR) 66 is deposited over the seed metal 64 and patterned so that the backside redistribution layer may be formed. In FIG. 4E, the backside redistribution layer 52, including the redistribution layer bond pads 16, is formed. As shown in FIG. 4E, the redistribution layer bond pads 16 have a non-linear or non-linear profile. In an embodiment, the method may be modified to form the redistribution layer bond pads 16 shown in FIGS. 2B-2D by, for example, using additional metal layers or material, depositing additional passivation layers or material, and so on.

In FIG. 4F, the photo resist 66 is stripped away or otherwise removed to expose the redistribution layer 52, which includes the redistribution layer bond pads 16 In FIG. 4G, a dry film release (DFR) layer 68 is deposited and patterned so that the through package vias (a.k.a., the through InFO vias) may be formed. In an embodiment, the dry film release layer 68 is deposited through a lamination process.

In FIG. 4H, the through package vias 50 are formed in the openings defined by the dry film release layer 68. Thereafter, as shown in FIG. 4I, the dry film release layer 68 is stripped away or otherwise removed. In addition, a removal process is performed to remove portions of the seed layer 64 disposed beyond the redistribution layer 52. In FIG. 4J, the die 36 (a.k.a., chip) is placed. In an embodiment, the die 36 is mounted to the exposed passivation layer 40 using the die attach film 42.

Next, as shown in FIG. 4K, the molding compound 38 is deposited over the die 36 and the through package vias 50 (a.k.a., through InFO vias, metal vias). As shown in FIG. 4L, a mold grinding process is performed to remove a top portion of the molding compound 38 and expose the metal vias 50 and contacts on the exterior surface of the die 36. In FIG. 4M, the front side redistribution layer 34 and the under bump metallization (UBM) is formed and then covered by the bottom package substrate 28.

In FIG. 4N, solder features 30 (e.g., solder balls from a BGA) are mounted and electrically coupled to the under bump metallization. In an embodiment, testing is performed at this stage to ensure the bottom package 14 has been suitably formed. Thereafter, the bottom package 14 is de-bonded from the carrier 62 and flipped over as shown in FIG. 4O.

In FIG. 4P, the glue layer 60 is removed and, optionally, the tape layer 46 is deposited. In FIG. 4Q, a laser drilling process is performed to produce the recess 58 and expose the redistribution layer bond pads 16 from the redistribution layer 52. In an embodiment, the recess 58 passes through the tape layer 46, the buffer layer 44, and the passivation layer 40. In FIG. 4R, individual bottom packages 14 are singulated from one another.

In FIG. 4S, the top package 12 is mounted onto the bottom package 14. In other words, a die bonding process is performed to reflow the solder features 54. In an embodiment, the top and bottom packages 12, 14 are electrically coupled together by reflowing the solder features 54. In FIG. 4T, the underfill 48 (or a sealing material, encapsulant, etc.), may optionally be inserted between or formed around the top and bottom packages 12, 14. Thereafter, as shown in FIG. 1, the PoP device 10 may be mounted to the printed circuit board 32.

From the foregoing it should be recognized that the protruding redistribution layer bond pads 16 provide beneficial features and advantages. For example, the protruding redistribution layer bond pads 16 permit a backside redistribution layer (RDL) to be formed in an Integrated Fan Out Package on Package (InFO PoP) device, prevent cracks from occurring or propagating within the PoP device (e.g., between the molding compound and the metal via, at the backside RDL polymer, etc.), and so on.

An embodiment package on package (PoP) device includes a molding compound having a metal via embedded therein, a passivation layer disposed over the molding compound, the passivation layer including a passivation layer recess vertically aligned with the metal via, and a redistribution layer bond pad capping the metal via, a portion of the redistribution layer bond pad within the passivation layer recess projecting above a top surface of the molding compound.

An embodiment package on package (PoP) device includes a molding compound having a metal via embedded therein, a passivation layer disposed over the molding compound, the passivation layer including a passivation layer recess vertically aligned with the metal via, a first redistribution layer bond pad capping the metal via, and a second redistribution layer bond pad vertically spaced apart from the first redistribution layer bond pad by a portion of the passivation layer, a portion of the second redistribution layer bond pad within the passivation layer recess projecting above a top surface of the molding compound.

An embodiment method of forming a through package via (TPV) for a package includes embedding a metal via in a molding compound, forming a passivation layer over the molding compound, forming a passivation layer recess in the passivation layer, the passivation layer recess vertically aligned with the metal via, and capping the metal via with a redistribution layer bond pad such that a portion of the redistribution layer bond pad within the passivation layer recess projects above a top surface of the molding compound.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method comprising:
    forming and patterning a passivation layer over a carrier substrate;
    forming a plurality of bond pads over the patterned passivation layer;
    forming a plurality of through vias on the plurality of bond pads, the plurality of through vias extending in a direction perpendicular to a major surface of the carrier substrate;
    attaching a first die to the patterned passivation layer;
    encapsulating the plurality of through vias and the first die with a molding compound;
    removing the carrier substrate; and
    patterning the patterned passivation layer to form a plurality of recesses in the patterned passivation layer, the plurality of bond pads being exposed in the recesses of the patterned passivation layer, each of the plurality of bond pads having sidewalls that taper in a direction away from the molding compound, bottommost surfaces of the plurality of bond pads being level with a bottommost surface of the patterned passivation layer, the bottommost surfaces of the plurality of bond pads and the bottommost surface of the patterned passivation layer facing away from the molding compound.

2. The method of claim 1 further comprising:
    before the removing the carrier substrate, forming a redistribution layer over the plurality of through vias, the first die, and the molding compound, the redistribution layer being electrically coupled to at least one of the plurality of through vias, the redistribution layer being electrically coupled to the first die; and
    forming a plurality of conductive connectors over and coupled to the redistribution layer.

3. The method of claim 1, wherein the forming the plurality of bond pads over the patterned passivation layer further comprises conformally forming the plurality of bond pads over the patterned passivation layer.

4. The method of claim 1 further comprising:
    forming a solder joint in at least one of the plurality of recesses, the solder joint contacting a top surface and sidewalls of the respective bond pad in the at least one of the plurality of recesses.

5. The method of claim 1, wherein second portions of the plurality of bond pads are embedded in the molding compound.

6. The method of claim 1, wherein diameters of the plurality of bond pads are greater than diameters of the plurality of through vias.

7. A method comprising:
    attaching a backside surface of a first die to a first side of a passivation layer, the first die having an active surface and the backside surface, the active surface being opposite the backside surface, the active surface of the first die comprising a plurality of contact pads, the backside surface of the first die facing the first side of the passivation layer;
    encapsulating the first die in a molding compound, the molding compound having a first side and a second side, the second side being opposite the first side;
    forming a metal via extending through the molding compound from the first side to the second side of the molding compound;
    forming a redistribution layer bond pad capping the metal via;
    recessing a second side of passivation layer to expose the redistribution layer bond pad, the second side of the passivation layer being opposite the first side, a first portion of the redistribution layer bond pad being within the passivation layer recess and projecting above the first side of the molding compound; and
    forming a solder joint contacting a top surface and sidewalls of the redistribution layer bond pad, the solder joint being at least partially within the passivation layer recess.

8. The method of claim 7, wherein a second portion of the redistribution layer bond pad is embedded in the molding compound.

9. The method of claim 7, wherein a diameter of the redistribution layer bond pad is greater than a diameter of the metal via.

10. The method of claim 7, wherein the sidewalls of the first portion of the redistribution layer bond pad projecting above the first side of the molding compound are spaced apart from sidewalls of the passivation layer.

11. The method of claim 7, wherein a diameter of the top surface of the redistribution layer bond pad is less than or equal to a diameter of a sidewall base of the redistribution layer bond pad.

12. The method of claim 7, wherein a height of the redistribution layer bond pad disposed above the molding compound is greater than or equal to a height of the passivation layer.

13. The method of claim 7, wherein a diameter $d_1$ of the top surface of the redistribution layer bond pad satisfies the formula: $d1=d2-2[h1(\tan \theta_2)]$, where $d_2$ is a diameter of a sidewall base of the redistribution layer bond pad, $h_1$ is a height of the passivation layer, and $\theta_2$ is a profile angle of the redistribution layer bond pad defined by sidewalls and a plane extending between a top surface of bond pad legs.

14. The method of claim 7, wherein a first plane intersects the first portion of the redistribution layer bond pad and the passivation layer, the first plane being parallel to the backside surface of the first die.

15. A method comprising:
forming a passivation layer over a carrier substrate;
patterning the passivation layer to form a plurality of openings therein, a width of each of the plurality of openings decreasing as the plurality of openings extend though the passivation layer toward the carrier substrate;
conformally depositing a first conductive layer over the patterned passivation layer and in the plurality of openings;
forming a plurality of conductive features on the first conductive layer;
patterning the first conductive layer into a plurality of bond pads, each of the plurality of conductive features being on a respective one of the plurality of bond pads, each of the plurality of bond pads having sidewalls within a respective one of the plurality of openings, the sidewalls tapering in a direction toward the carrier substrate;
attaching a first die to the patterned passivation layer;
encapsulating the plurality of conductive features and the first die with a molding compound, the encapsulated plurality of conductive features extending through the molding compound to form a plurality of through vias;
removing the carrier substrate; and
patterning the patterned passivation layer to form a plurality of recesses in the patterned passivation layer, the plurality of bond pads having first portions exposed in the recesses of the patterned passivation layer.

16. The method of claim 15 further comprising:
before the removing the carrier substrate, forming a redistribution layer over the plurality of through vias, the first die, and the molding compound, the redistribution layer being electrically coupled to at least one of the plurality of through vias, the redistribution layer being electrically coupled to the first die; and
forming a plurality of conductive connectors over and coupled to the redistribution layer.

17. The method of claim 15 further comprising:
forming a solder joint in at least one of the plurality of recesses, the solder joint contacting a top surface and sidewalls of the respective bond pad in the at least one of the plurality of recesses.

18. The method of claim 15, wherein second portions of the plurality of bond pads are embedded in the molding compound.

19. The method of claim 18, wherein a portion of the passivation layer separates second portions of the plurality of bond pads from the first portions of the plurality of bond pads.

20. The method of claim 15, wherein the tapered sidewalls of the plurality of bond pads taper in a direction away from the molding compound.

* * * * *